(12) United States Patent
Nakata

(10) Patent No.: US 10,263,024 B2
(45) Date of Patent: Apr. 16, 2019

(54) IMAGING ELEMENT, ELECTRONIC DEVICE, AND MANUFACTURING METHOD

(71) Applicant: SONY CORPORATION, Tokyo (JP)

(72) Inventor: Masashi Nakata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/908,201

(22) PCT Filed: May 27, 2015

(86) PCT No.: PCT/JP2015/065193
§ 371 (c)(1),
(2) Date: Jan. 28, 2016

(87) PCT Pub. No.: WO2015/190290
PCT Pub. Date: Dec. 17, 2015

(65) Prior Publication Data
US 2017/0084653 A1 Mar. 23, 2017

(30) Foreign Application Priority Data
Jun. 9, 2014 (JP) .................. 2014-118611

(51) Int. Cl.
*H01L 27/146* (2006.01)
*H04N 5/369* (2011.01)
*H04N 5/232* (2006.01)

(52) U.S. Cl.
CPC .... *H01L 27/14623* (2013.01); *H01L 27/1461* (2013.01); *H01L 27/1464* (2013.01);
(Continued)

(58) Field of Classification Search
CPC .............................................. H01L 27/14623
(Continued)

(56) References Cited

U.S. PATENT DOCUMENTS

2006/0138485 A1 6/2006 Jung
2011/0241148 A1* 10/2011 Hiyama ............ H01L 27/14623
257/435
(Continued)

FOREIGN PATENT DOCUMENTS

JP 2002-313911 A 10/2002
JP 2003-332544 A 11/2003
(Continued)

OTHER PUBLICATIONS

Official Action (no English translation available) for Japanese Patent Application No. 2014-118611 dated Mar. 28, 2017, 7 pages.
(Continued)

*Primary Examiner* — Ajay K Arora
(74) *Attorney, Agent, or Firm* — Sheridan Ross P.C.

(57) ABSTRACT

The present technology relates to an imaging element, an electronic device, and a manufacturing method that make it possible to prevent color mixing in a pixel adjacent to a phase difference detection pixel and to make the light receiving sensitivity high or more. An anti-reflection film is formed only on the side wall of a light blocking unit that blocks part of the incident light on a photo diode of phase difference detection pixels for detecting the phase difference out of a plurality of pixels. Thereby, the light reflected at the side wall of the light blocking unit does not enter a photo diode of an adjacent pixel, and therefore color mixing is prevented. Furthermore, since the anti-reflection film is not formed on an interlayer layer, the light receiving sensitivity of the light that directly enters the photo diode is not reduced. The present technology can be applied to imaging elements.

12 Claims, 15 Drawing Sheets

(52) U.S. Cl.
CPC .. *H01L 27/14607* (2013.01); *H01L 27/14621* (2013.01); *H01L 27/14627* (2013.01); *H01L 27/14645* (2013.01); *H01L 27/14685* (2013.01); *H04N 5/369* (2013.01); *H04N 5/3696* (2013.01); *H04N 5/23212* (2013.01)

(58) Field of Classification Search
USPC ......................................................... 257/435
See application file for complete search history.

(56) References Cited

U.S. PATENT DOCUMENTS

2011/0279727 A1* 11/2011 Kusaka ............. H01L 27/14621
348/340
2011/0298072 A1* 12/2011 Chuang ............... H01L 27/1462
257/432
2016/0035780 A1* 2/2016 Itahashi ............... H04N 5/3765
348/294

FOREIGN PATENT DOCUMENTS

| | | |
|---|---|---|
| JP | 2004-104203 A | 4/2004 |
| JP | 2008-305873 A | 12/2008 |
| JP | 2010-160313 | 7/2010 |
| JP | 2010-263228 | 11/2010 |
| JP | 2011-23409 A | 2/2011 |
| JP | 2012-38768 A | 2/2012 |
| JP | 2012-242717 | 12/2012 |
| JP | 2012-248682 | 12/2012 |
| JP | 2013-115384 A | 6/2013 |
| JP | 2013-175582 | 9/2013 |
| JP | 2014-67948 A | 4/2014 |
| WO | WO 2012/073402 A1 | 6/2012 |

OTHER PUBLICATIONS

International Search Report prepared by the Japanese Patent Office dated Jul. 7, 2015, for International Application No. PCT/JP2014/065193.

* cited by examiner

IMAGING ELEMENT, ELECTRONIC DEVICE, AND MANUFACTURING METHOD

CROSS REFERENCE TO RELATED APPLICATIONS

This application is a national stage application under 35 U.S.C. 371 and claims the benefit of PCT Application No. PCT/JP2015/065193 having an international filing date of 27 May 2015, which designated the United States, which PCT application claimed the benefit of Japanese Patent Application No. 2014-118611 filed 9 Jun. 2014, the disclosures of which are incorporated herein by reference in their entirety.

TECHNICAL FIELD

The present technology relates to an imaging element, an electronic device, and a manufacturing method, and relates particularly to an imaging element, an electronic device, and a manufacturing method that make it possible to prevent color mixing to a pixel adjacent to a phase difference detection pixel and to improve the sensitivity of the phase difference detection pixel.

BACKGROUND ART

An imaging technology in which a phase difference detection pixel that is partly shielded from light is provided to enable the focus shift of a lens to be detected is proposed (e.g. see Patent Literature 1).

This is a technology in which the amount of shift from the focus position (focus shift) is found on the basis of the mutual phase difference found from, out of the pixels constituting an imaging element, a pair of phase difference detection pixels in which portions on the left side and the right side are shielded from light by a light blocking unit, and the focus is corrected in accordance with the shift amount; thereby, what is called autofocus is achieved.

CITATION LIST

Patent Literature

Patent Literature 1: JP 2010-160313A

SUMMARY OF INVENTION

Technical Problem

However, in the technology described in Patent Literature 1, when the light blocking unit is formed of a metal with a high reflection ratio or the like, there has been a case where the light incident on the side wall of the light blocking unit is scattered and enters an adjacent pixel, and consequently color mixing occurs.

Since the component of the light scattered and entering an adjacent pixel may increase the output of the adjacent pixel abnormally, there has been a case where, as the image quality, the output is seen as a bright point that stands out.

Furthermore, since the quantity of light entering an adjacent pixel constitutes a loss in the incident light on the phase difference detection pixel, the sensitivity of the phase difference detection pixel may be reduced; particularly during low illuminance, since the influence tends to be great, there has been a concern that the phase difference cannot be detected appropriately.

The present technology is developed in view of such circumstances; and suppresses particularly light entry into a pixel adjacent to the phase difference detection pixel caused by reflection at the side wall of the light blocking unit, and thus makes it possible to prevent color mixing to the adjacent pixel and to improve the detection sensitivity of the phase difference detection pixel to detect the phase difference appropriately.

Solution to Problem

According to an aspect of the present technology, there is provided an imaging element including: a photo diode configured to generate a pixel signal for each of a plurality of pixels by photoelectric conversion in accordance with a received light intensity; and a light blocking unit configured to block part of incident light on the photo diode of pixels for detecting a phase difference out of the plurality of pixels. A color mixing prevention film is formed on a side wall of the light blocking unit.

The light blocking unit can be formed in part of a color filter layer on an interlayer film in a stage prior to the photo diode with respect to a direction of incidence of light. The color mixing prevention film can be formed of a material with a refractive index higher than a refractive index of the interlayer film.

A material of the interlayer film can include $SiO_2$. A material of the color mixing prevention film can include SiCN, SiN, SiC, SiON, and $HfO_2$ having a higher refractive index than the $SiO_2$.

The color mixing prevention film formed on the side wall of the light blocking unit can be formed to become thicker with respect to a surface of the side wall with movement in a direction of incidence of the light.

The color mixing prevention film formed on the side wall of the light blocking unit can be formed in a curved surface shape.

The color mixing prevention film on the side wall of the light blocking unit can be formed by dry etching.

The color mixing prevention film on the side wall of the light blocking unit can be formed of a plurality of layers.

The color mixing prevention film on the side wall of the light blocking unit can be formed on an upper surface in addition to on the side wall of the light blocking unit.

Incident light on the photo diode can be light applied by either of front-side illumination and back-side illumination.

According to an aspect of the present technology, there is provided an electronic device including: a photo diode configured to generate a pixel signal for each of a plurality of pixels by photoelectric conversion in accordance with a received light intensity; and a light blocking unit configured to block part of incident light in a stage prior to the photo diode of pixels for detecting a phase difference out of the plurality of pixels. A color mixing prevention film is formed on a side wall of the light blocking unit.

According to an aspect of the present technology, there is provided a method for manufacturing an imaging element, the imaging element including a photo diode configured to generate a pixel signal for each of a plurality of pixels by photoelectric conversion in accordance with a received light intensity, and a light blocking unit configured to block part of incident light in a stage prior to the photo diode of pixels for detecting a phase difference out of the plurality of pixels. A color mixing prevention film is formed on a side wall of the light blocking unit. The method includes: stacking a layer configured to form the light blocking unit; forming an opening in a position corresponding to the photo diode in the layer configured to form the light blocking unit; forming the color mixing prevention film on the layer configured to form the light blocking unit; and removing part of the color mixing prevention film by the dry etching.

In an aspect of the present technology, a pixel signal is generated for each of a plurality of pixels by photoelectric conversion by a photo diode in accordance with the received light intensity, part of the incident light is blocked by a light blocking unit in a stage prior to the photo diode of pixels for detecting the phase difference out of the plurality of pixels, and a color mixing prevention film is formed on the side wall of the light blocking unit.

An imaging element of an aspect of the present technology may be an independent configuration, or may be a block that performs imaging processing.

Advantageous Effects of Invention

According to an aspect of the present technology, it becomes possible to suppress color mixing of an adjacent pixel caused by reflection at a light blocking unit of a phase difference detection pixel and to improve the light receiving sensitivity of the phase difference detection pixel.

DESCRIPTION OF EMBODIMENTS

<Example of Application to an Imaging Device>

Figure 1:
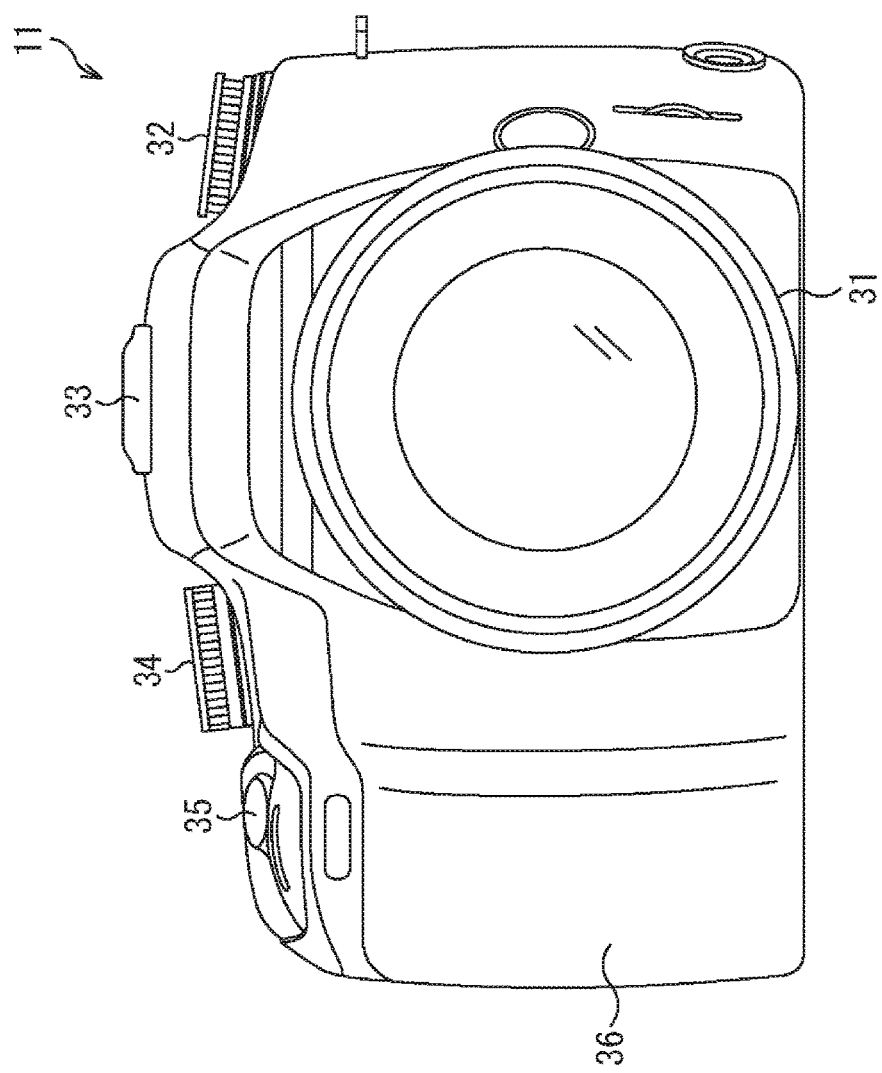
FIG. 1 is a diagram showing a configuration example of an embodiment of an imaging device to which the present technology is applied.

FIG. 1 shows a configuration example of an embodiment of an imaging device using an imaging element of the present technology.

FIG. 1 shows an external appearance configuration example of an imaging device 11 using an imaging element in which scattering caused by the side wall of a light blocking unit of a phase difference detection pixel included in the imaging element is suppressed, and thereby it has become possible to prevent color mixing to an adjacent pixel and to improve the light receiving sensitivity of the phase difference detection pixel to detect the phase difference appropriately.

The imaging device 11 is composed of a lens 31, an operating mode switching dial 32, a flash light 33, an imaging mode switching dial 34, a shutter button 35, and a cabinet 36.

The operation of the lens 31 is controlled by a lens control unit 63 described later (FIG. 2), and the lens 31 causes the incident light from a subject to be formed as an image appropriately on an imaging element 52 (FIG. 2) by adjusting the focus position.

The operating mode switching dial 32 is a dial operated by a user at the time of switching the imaging mode of the imaging device 11. The operating mode includes a high-speed consecutive imaging mode, a low-speed consecutive imaging mode, a non-consecutive imaging mode, a timer imaging mode, etc., for example.

When the brightness around the subject is insufficient during imaging, the flash light 33 pops up a not-illustrated light emitting unit automatically or manually, and emits light to the area of the subject at a prescribed timing.

The imaging mode switching dial 34 is a dial operated by the user at the time of switching the imaging mode. The imaging mode includes a shutter speed preference mode, an aperture stop preference mode, an automatic mode, etc.

The shutter button 35 is a button operated by the user at the time of taking an image using the imaging device 11 or setting the focus. When the shutter button 35 is half pressed, the focus is set; and when the shutter button 35 is fully pressed, imaging is performed. The shutter button 35 is configured such that imaging can be performed while the user holds the main body by capturing the shutter button 35 together with the cabinet 36.

<Configuration Example of the Imaging Device>

Next, a configuration example that achieves the function of the imaging device 11 of FIG. 1 is described with reference to the block diagram of FIG. 2.

The imaging device 11 includes the lens 31, an optical filter 51, am imaging element 52, an analogue/digital (A/D) conversion unit 53, a clamp unit 54, a defect correction unit 55, a demosaic unit 56, an LM/gamma correction unit 57, a luminance chroma signal generation unit 58, a video IF 59, a display unit 60, and a recording unit 61.

The optical filter 51 smoothes the incident light transmitted through the lens 31, and causes the smoothed light to be incident on the imaging element 52 on a pixel basis.

The imaging element 52 converts the light incident from the optical filter 51 to a charge signal by the photoelectric effect, and outputs the charge signal to the A/D conversion unit 53 as a pixel signal on a pixel basis in accordance with the charge signal.

The analogue/digital (A/D) conversion unit 53 converts the analogue pixel signal outputted from the imaging element 52 to a digital signal, and outputs the digital signal to the clamp unit 54.

The clamp unit 54 offsets noise components of the pixel signal supplied from the A/D conversion unit 53, which noise components are caused by dark current in a pixel shielded from light called an optical black (OPB), and outputs the resulting signal to a phase difference detection unit 62 and the defect correction unit 55. That is, the noise components caused by dark current are removed by this processing.

The defect correction unit 55 corrects detects occurring on the imaging element 52 on the basis of the pixel signal supplied from the clamp unit 54, and supplies the resulting signal to the demosaic unit 56.

The demosaic unit 56 generates a pixel signal of each of RGB by demosaic on the basis of the pixel signal in which detects have been corrected by the defect correction unit 55, and supplies the generated pixel signal to the LM/gamma correction unit 57.

The LM/gamma correction unit 57 makes brightness (luminance; LM) correction and gamma correction on the signal of each pixel of the demosaic image of each of RGB supplied from the demosaic unit 56, and supplies the resulting signal to the luminance chroma signal generation unit 58.

The luminance chroma signal generation unit 58 generates a luminance signal and a chroma signal on the basis of the pixel signal of RGB supplied from the LM/gamma correction unit 57, uses these signals to generate an image signal, and outputs the image signal to the video IF 59.

The video IF 59 outputs the image signal to the display unit 60 formed of a liquid crystal display (LCD), an organic electro-luminescence (EL), or the like and causes the image signal to be displayed, or outputs the image signal to the recording unit 61 formed of a hard disc drive (HDD), a solid state drive (SSD), a semiconductor memory, or the like and causes the image signal to be recorded as data.

The phase difference detection unit 62 finds the phase difference on the basis of the signals of, out of the phase difference detection pixels, a pair of pixels in which a light blocking unit is provided on the left and right sides; calculates the amount of shift from the focus position of the lens 31; and supplies the shift amount to a lens control unit 63.

The lens control unit 63 controls the lens 31 on as to adjust the shift amount supplied from the phase difference detection unit 62, which shift amount has been calculated on the basis of the phase difference based on the pixel signals of the phase difference detection pixels. Thereby, autofocus is achieved.

<With Regard to the Configuration of a Common Phase Difference Detection Pixel>

Next, the configuration of a common phase difference detection pixel is described.

Figure 3:
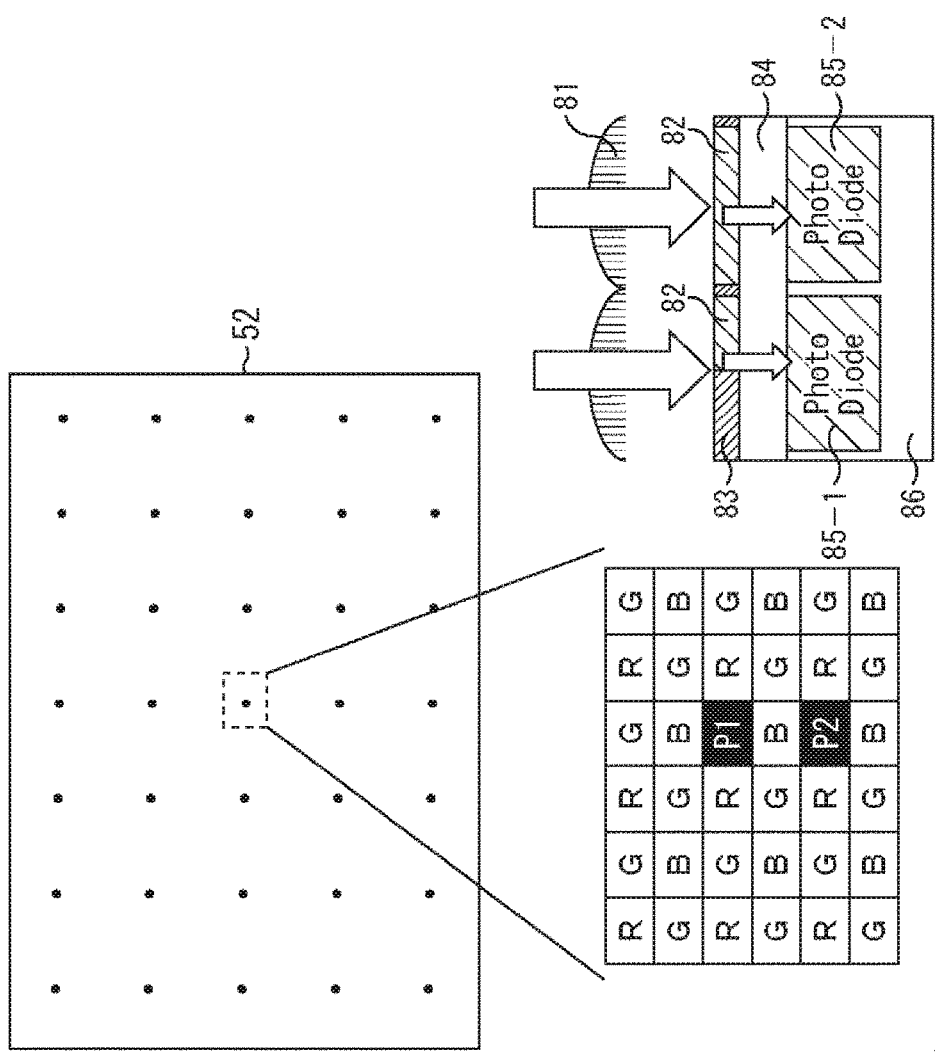
FIG. 3 is a diagram describing a configuration example of an imaging element.

As shown in FIG. 3, color filters 82 formed of the Bayer arrangement or the like are set in the imaging element 52, for example. Of the light incident via on-chip lenses 81, lights of prescribed wavelengths corresponding to RGB (or IR) in the lower left portion of FIG. 3 are transmitted to pass through an interlayer film 84 made of $SiO_2$ or the like as shown in the lower right portion of FIG. 3, and are caused to be incident on photo diodes 85-1 and 85-2 provided on a silicon (Si) substrate 86. The photo diodes 85-1 and 85-2 generate a charge by the photoelectric effect in accordance with the quantity of incident light, and outputs a pixel signal in accordance with the generated charge.

In FIG. 3, a front view of the whole of the imaging element 52 as viewed from the side from which light is incident is shown in the upper center portion, the lower center portion of FIG. 3 shows an example of the pixel arrangement of the imaging element 52, and the RGB shows the color filter that transmits light corresponding to the wavelength of each color. The lower right portion of FIG. 3 is a side surface cross-sectional view for pixels marked with P1 and R, or P2 and R in the lower center portion of the drawing.

For the pixels marked with P1 and P2 in part of FIG. 3, a light blocking unit 83 for blocking part of the incident light is provided as shown in the configuration example of the pixel on the left side in the lower right portion of FIG. 3. The pixels P1 and P2 provided with the light blocking unit 83 are phase difference detection pixels. For the pixel on the left side in the lower right portion of FIG. 3, an example in which the light blocking unit 83 is provided in the upper left portion in the drawing of the photo diode 85-1 forming the pixel is shown; but although not illustrated, there is also a pixel in which the light blocking unit 83 is provided in the upper right portion.

In the signal of the pixel in which the light blocking unit 83 is thus provided in the upper left portion or the upper right portion, the left or right portion of the incident light is blocked; therefore, it can be found which direction the incident light on the photo diode 85 is incident from, and the focus shift amount can be found on the basis of the mutual phase difference. Since it is thus sufficient to be able to find the shift amount of the phase difference, the color that is set on the color filter 82-1 of the phase difference detection pixel may be any color, and an all wavelength transmission filter is possible, for example.

Figure 4:
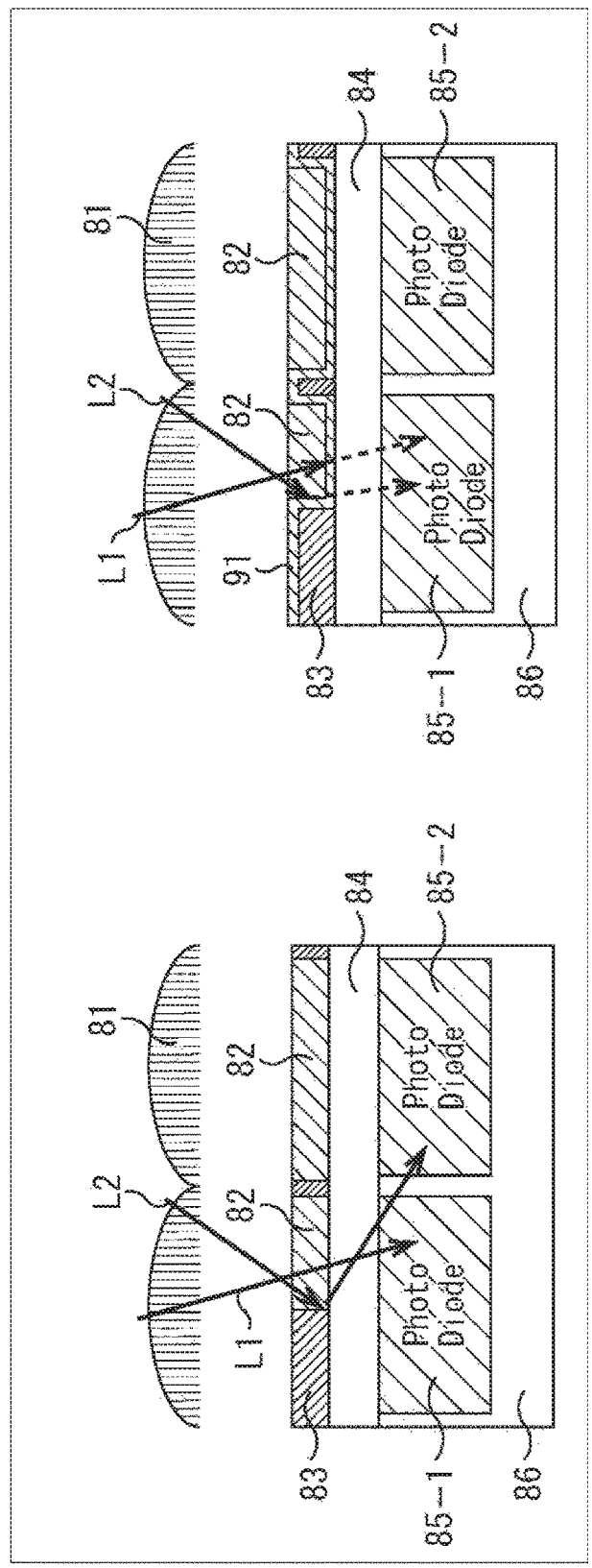
FIG. 4 is a diagram describing a configuration example of a common imaging element.

Consideration will now be given to the case where, for the phase difference detection pixel thus configured, there are incident lights L1 and L2 incident via the on-Chip lens 81 as shown in FIG. 4, for example.

As shown by the left portion of FIG. 4, in the case where the light blocking unit 83 is, for example, a metal such as tungsten W, incident light L1 is transmitted through the color filter 82 and the interlayer film 84, and enters the photo diode 85-1.

On the other hand, incident light L2 is reflected and scattered at the side wall of the light blocking unit 83, and part of the light enters the photo diode 85-2 of an adjacent pixel via the interlayer film 84; as a result, color mixing occurs in the photo diode 85-2, and a reduction in sensitivity is caused in the photo diode 85-1.

Thus, as shown by the right portion of FIG. 4, a technology is proposed in which an anti-reflection film 91 is formed in a stage after the light blocking unit 83 is formed and before the color filter 82 is formed, and then the color filter 82 is formed; thereby, the occurrence of color mixing is suppressed. As the anti-reflection film 91, for example, SiCN, SiC, SiON, or $HfO_2$ is used because a material with a high refractive index is ideal.

By the anti-reflection film 91 being formed as shown by the right portion of FIG. 4, incident light L1 is transmitted through the color filter 82, is then transmitted through the anti-reflection film 91, and enters the photo diode 85-1. Furthermore, incident light L2 is transmitted through the color filter 82; is then reflected at the side wall of the light blocking unit 83, with the reflection direction based on the anti-reflection film 91 with a high refractive index; is thereby transmitted through the anti-reflection film 91 again; and enters the photo diode 85-1 via the interlayer film 84.

Consequently, both the incident lights L1 and L2 enter the photo diode 85-1, and therefore the occurrence of color mixing is suppressed.

In the path until the incident light enters the photo diode 85, the incident light L1 once passes through the anti-reflection film 91 and is reflected at the light blocking unit 83, and then passes through the anti-reflection film 91 again and enters the photo diode 85 via the interlayer film 84. In contrast, the incident light L2 passes through the anti-reflection film 91 and the interlayer film 84, and directly enters the photo diode 85.

Figure 5:
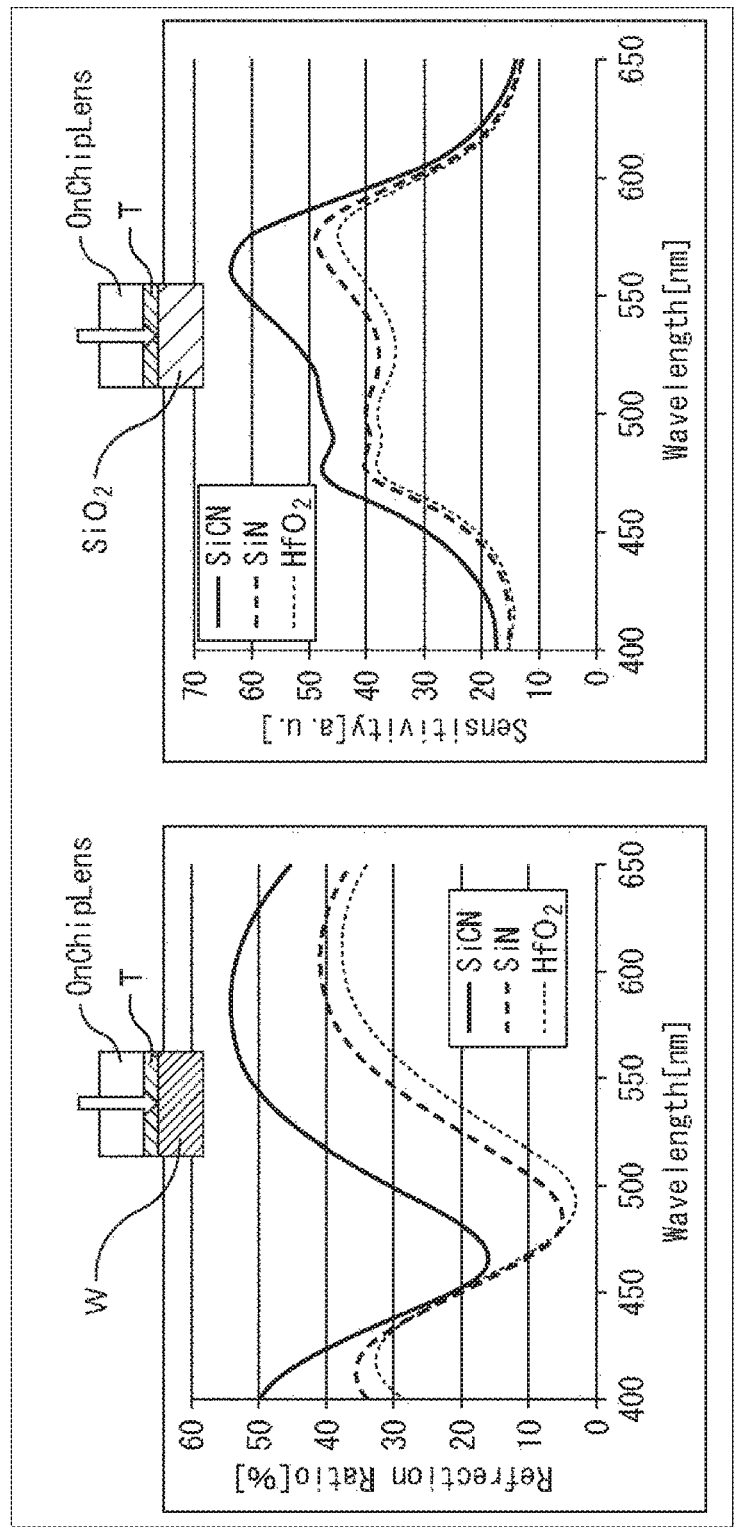
FIG. 5 is a diagram describing the relationship between the wavelength and the reflection ratio of the incident light on a material in which an anti-reflection film is provided on a reflection film and the relationship between the wavelength and the light receiving sensitivity of the incident light on a material in which an anti-reflection film is provided on an intermediate film.

As the material of the anti-reflection film 91, SiCN, SiN, or $HfO_2$ may be possible; as shown by the left portion of the FIG. 5, is lowest in reflection ratio, followed in order by SiN and SiCN, which can be regarded as good in this descending order. Therefore, for the incident light L2, since the reflection ratio is reduced, the effect of suppressing the occurrence of color mixing can be regarded as high.

On the other hand, the incident light L1 or the incident light L2 after reflection passes through the anti-reflection film 91 and the interlayer film ($SiO_2$), and enters the photo diode 85; as shown by the right portion of FIG. 5, SiCN is highest in light receiving sensitivity on having passed through the anti-reflection film 91, followed in order by SiN and $HfO_2$, which can be regarded as good in this descending order.

In the left portion of FIG. 5, the relationship between the wavelength and the reflection ratio of the incident light when the light incident from the on-chip lens 81 is incident via an anti-reflection film T formed on the upper surface of the light blocking unit 83 made of tungsten W is shown. In the left portion of FIG. 5, the relationship of the reflection ratio to the wavelength of the incident light is shown, with the wavelength of the incident light on the horizontal axis and the refrection ratio on the vertical axis.

In the right portion of FIG. 5, the relationship between the wavelength and the light receiving sensitivity of the incident light when the light incident from the on-chip lens 81 is incident via the anti-reflection film T formed on the upper surface of the interlayer film 84 made of $SiO_2$ is shown. In the right portion of FIG. 5, the horizontal axis represents the wavelength of the incident light, and the vertical axis represents the light receiving sensitivity.

FIG. 5 is simple simulations of a vertical incident light model and has reproduced only major portions of the element structure, and therefore does not completely agree with the characteristics of the actual imaging element.

As a result, for the anti-reflection film 91, one with the highest reflection ratio has a low light receiving sensitivity, and one with a high light receiving sensitivity has a low reflection ratio. Therefore, as the material of the anti-reflection film 91, comprehensively considering, it is necessary to select a material by which the incident light is reflected by the light blocking unit 83 and is less likely to enter an adjacent pixel, that is, a material that can provide a situation where the reflection ratio is reduced to some extent and at the same time the light receiving sensitivity is increased to some extent. That is, since there is a trade-off between the reflection ratio and the light receiving sensitivity, the structure shown by the left portion of FIG. 4 has a limit in reducing color mixing to an adjacent pixel and at the same time increasing the light receiving sensitivity.

Figure 2:
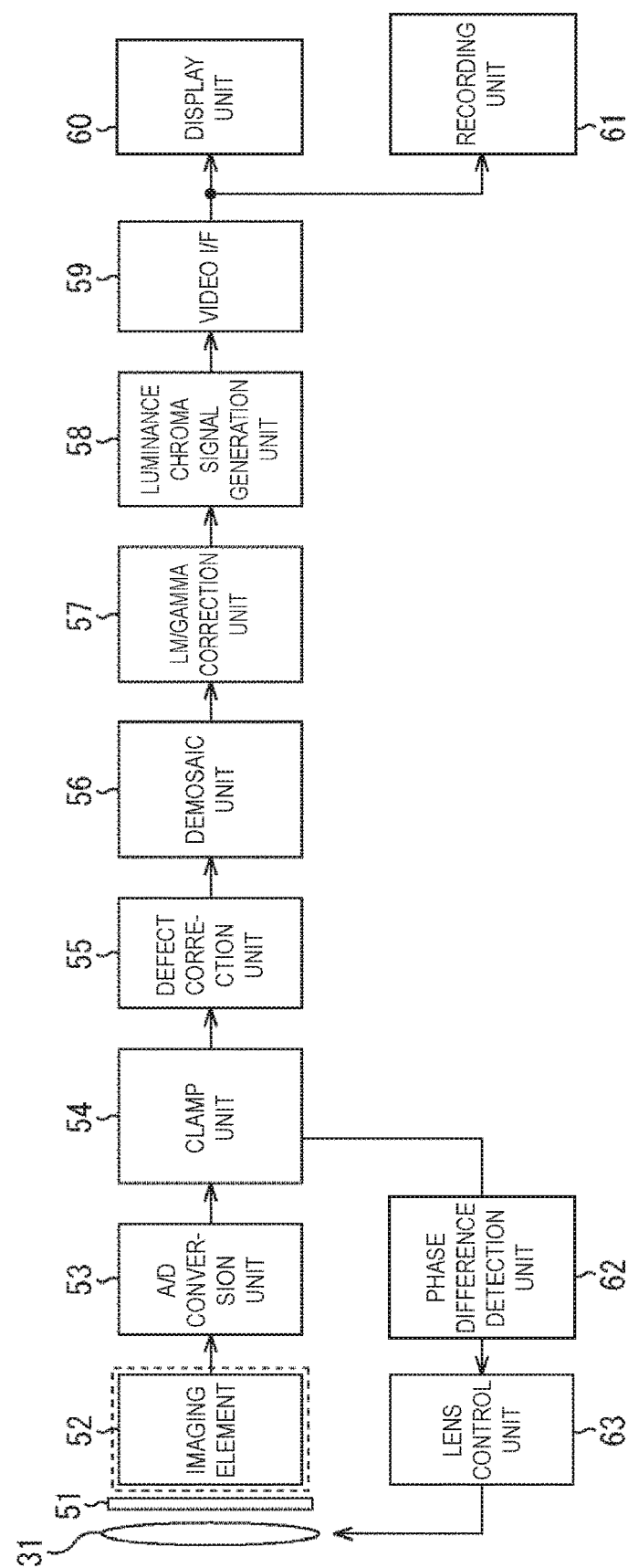
FIG. 2 is a block diagram describing a configuration example that achieves the function of the imaging device of FIG. 1.

<Configuration Example of the Light Blocking Unit of the Imaging Element of FIG. 2>

Next, a configuration example of the light blocking unit of the imaging element 52 of FIG. 2 is described.

As described above, it can be said that the selection of the material of the light blocking unit is very difficult. Hence, in the imaging element 52 of FIG. 2, a color mixing prevention film 101 with a configuration like that shown by the left portion of FIG. 6 is formed for the light blocking unit 83.

Figure 6:
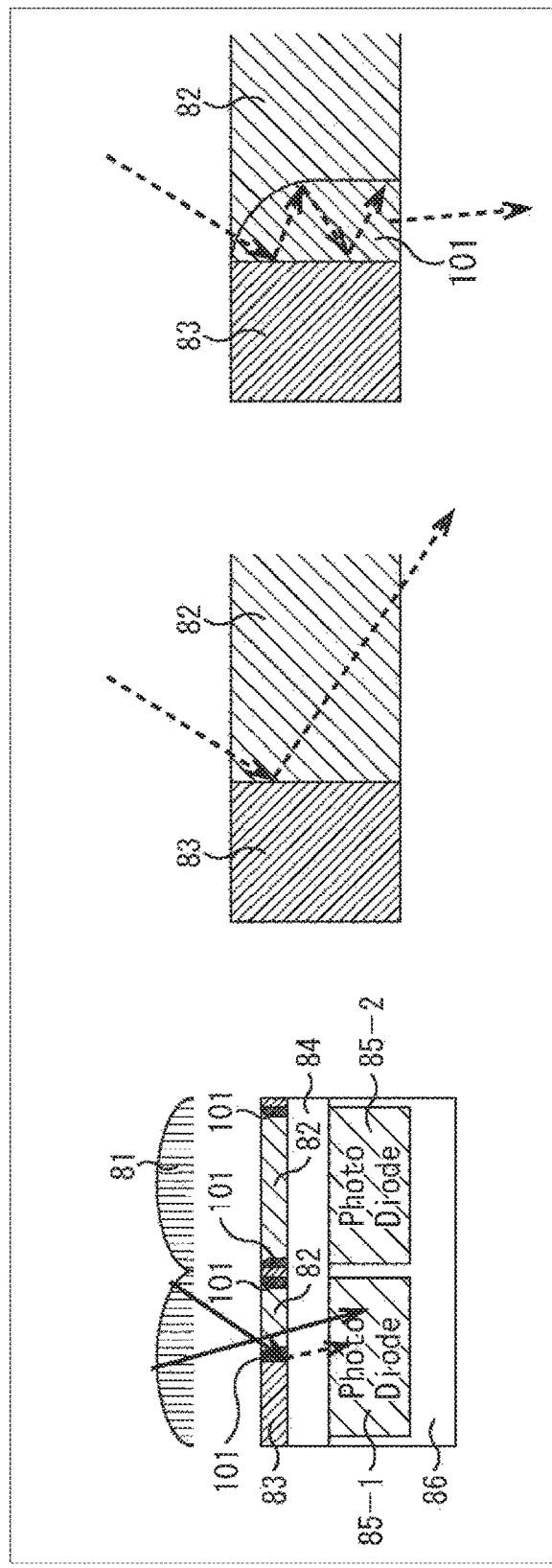
FIG. 6 is a diagram describing a configuration example of an imaging element of an imaging device to which the present technology is applied.

That is, as shown by the left portion of FIG. 6, the color mixing prevention film 101 is formed only on the side wall of the light blocking unit 83. The color mixing prevention film 101 is formed only on the side wall of the light blocking unit 83, and the upper portion of the color mixing prevention film 101 is formed in a curved surface shape. The color mixing prevention film 101 is formed of a material with a higher refractive index than the color filter 82 and the interlayer film ($SiO_2$) 84 in contact with the color mixing prevention film 101, and is made of, for example, SiCN, SiN, SiON, or $HfO_2$.

When, for example, the incident light is incident as shown by the dotted line in the center portion of FIG. 6, there has been a case where the incident light enters an adjacent pixel if the color mixing prevention film 101 does not exist. However, as shown by the right portion of FIG. 6, which is an enlarged view of the configuration of the left portion of FIG. 6, the color mixing prevention film 101 functions like a waveguide. That is, by using a film with a much higher refractive index than the surroundings as the color mixing prevention film 101, the characteristic that light is likely to be confined in a film with a high refractive index is utilized. Such a waveguide is widely used in front-side illumination imaging elements. For example, JP 2010-232595A etc. are given as references. By such a configuration, upon entering the color mixing prevention film 101, the incident light is sequentially reflected in the color mixing prevention film 101, and when transmitted through the color mixing prevention film 101, passes through the interlayer film 84 and enters the photo diode 85.

Consequently, the incident light that has so far been reflected by the side wall of the light blocking unit 83 enters the photo diode 85 therefore, the occurrence of color mixing caused by light entry into an adjacent pixel can be suppressed. Furthermore, since the color mixing prevention film 101 is not provided in the other area, incident light corresponding to the incident light L1 in FIG. 4 enters the photo diode 85 without being transmitted through the color mixing prevention film 101; therefore, the attenuation of light receiving sensitivity caused by the color mixing prevention film 101 can be suppressed.

As a result, the entry of the incident light into the photo diode 85 of an adjacent pixel caused by scattering at the side surface of the light blocking unit 83 is suppressed, and therefore the occurrence of color mixing is suppressed. Furthermore, the attenuation of light receiving sensitivity of the incident light that is not incident on the light blocking unit 83 but directly enters the photo diode 85 via the interlayer film 84 can be prevented, in any case, the reduction in light receiving sensitivity in the phase difference detection pixel can be suppressed.

<Manufacturing Method>

Figure 7:
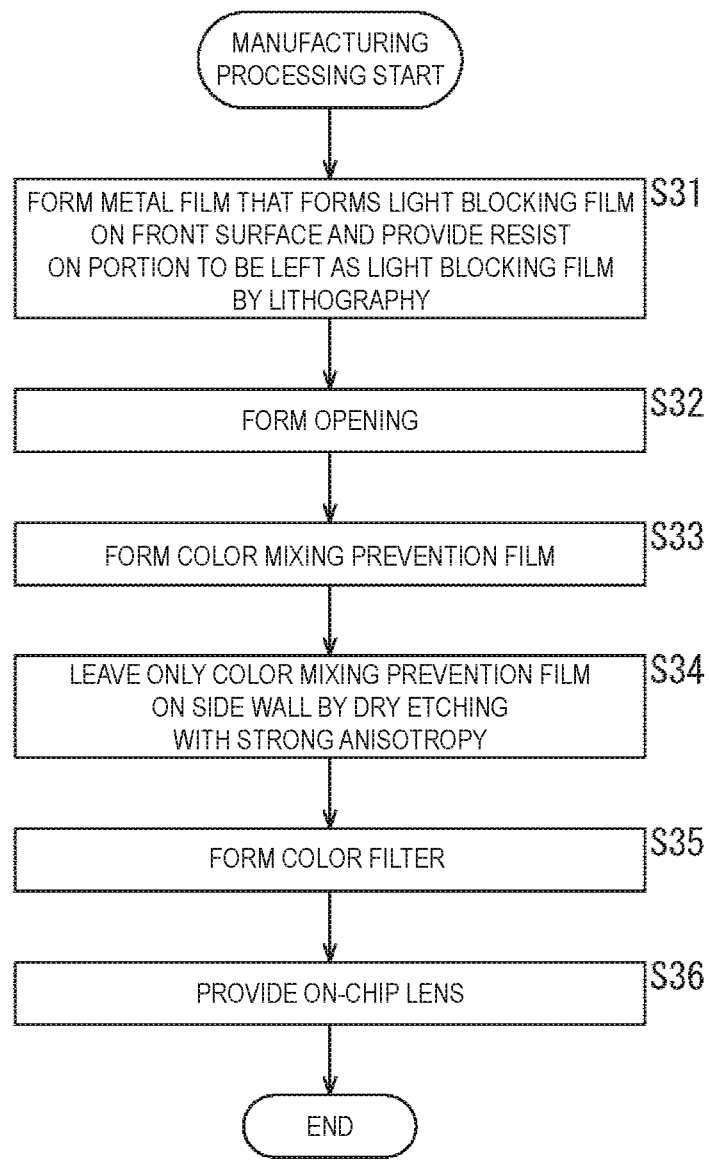
FIG. 7 is a flow chart describing a method for manufacturing an imaging element of the imaging device of FIG. 1.

Next, a method for manufacturing the imaging element 52 of FIG. 2 is described with reference to the flow chart of FIG. 7.

Figure 8:
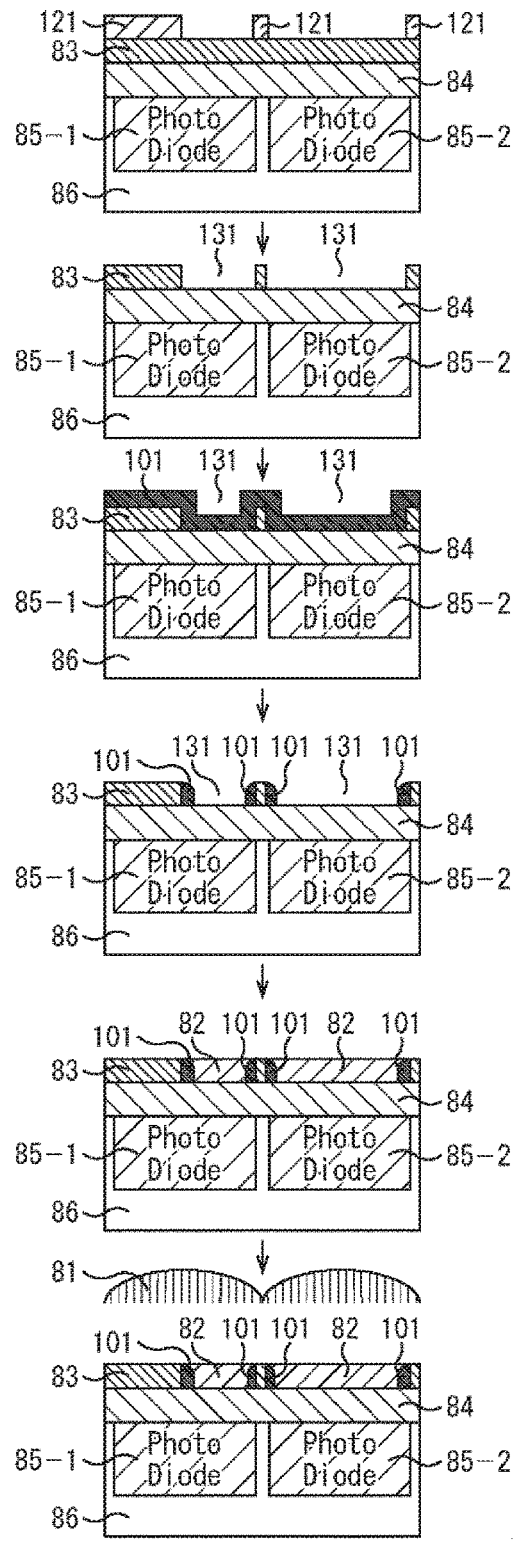
FIG. 8 is a diagram describing a method for manufacturing an imaging element of the imaging device of FIG. 1.

In step S31, as shown by the uppermost stage of FIG. 8, the photo diodes 85-1 and 85-2 are formed on the Si substrate 86, then the interlayer film 84 made of $SiO_2$ is formed, after that the light blocking unit 83 is stacked, and then a resist 121 is formed by lithography on a portion where the light blocking unit 83 is to be left.

In step S32, as shown by the second highest stage of FIG. 8, openings 131 are formed by etching.

In step S33, as shown by the third highest stage of FIG. 8, the color mixing prevention film 101 made of, for example, SiCN, SiN, SiC, SiON, HfO$_2$, and the like, which have higher refractive indices than SiO$_2$ that is the interlayer film 84, is formed by atomic layer deposition (A/D), chemical vapor deposition (CVD), or sputtering.

In step S34, as shown by the fourth highest stage of FIG. 8, the color mixing prevention film 101 is etched by dry etching with strong anisotropy so as to be left only on the side wall of the light blocking unit 83. Thereby, the color mixing prevention film 101 is left only on the side wall of the light blocking unit 83, and the corner on the side from which light is incident is formed in a curved surface shape. At this time, the portion of the color mixing prevention film 101 to be left by lithography may be sorted.

In step S35, as shown by the fifth highest stage of FIG. 8, the color filter 82 is formed in the opening 131. In the phase difference detection pixel, the color filter 82 may be either RGB or IR, or may be an all wavelength transmission filter.

In step S36, as shown by the sixth highest stage of FIG. 8, the on-chip lens 81 is provided on the uppermost layer.

By a manufacturing method like the above, the occurrence of color mixing caused by light entry into an adjacent pixel can be suppressed. Furthermore, since the color mixing prevention film 101 is not provided in the area other than the side wall of the light blocking unit 83, the incident light not reflected at the light blocking unit 83 enters the photo diode 85 without being transmitted through the color mixing prevention film 101; therefore, the attenuation of light receiving sensitivity caused by the color mixing prevention film 101 can be suppressed.

As a result, the entry of the incident light into the photo diode 85 of an adjacent pixel caused by scattering at the side surface of the light blocking unit 83 is suppressed, and therefore the occurrence of color mixing can be suppressed. Furthermore, the attenuation of light receiving sensitivity of the incident light that is not incident on the light blocking unit 83 but directly enters the photo diode 85 via the interlayer film 84 can be prevented. In any case, the reduction in light receiving sensitivity in the phase difference detection pixel can be suppressed.

First Modification Example

Although an example in which the color mixing prevention film 101 is provided in only one layer is described in the above, it is possible to provide the same or a larger number of layers.

Figure 9:
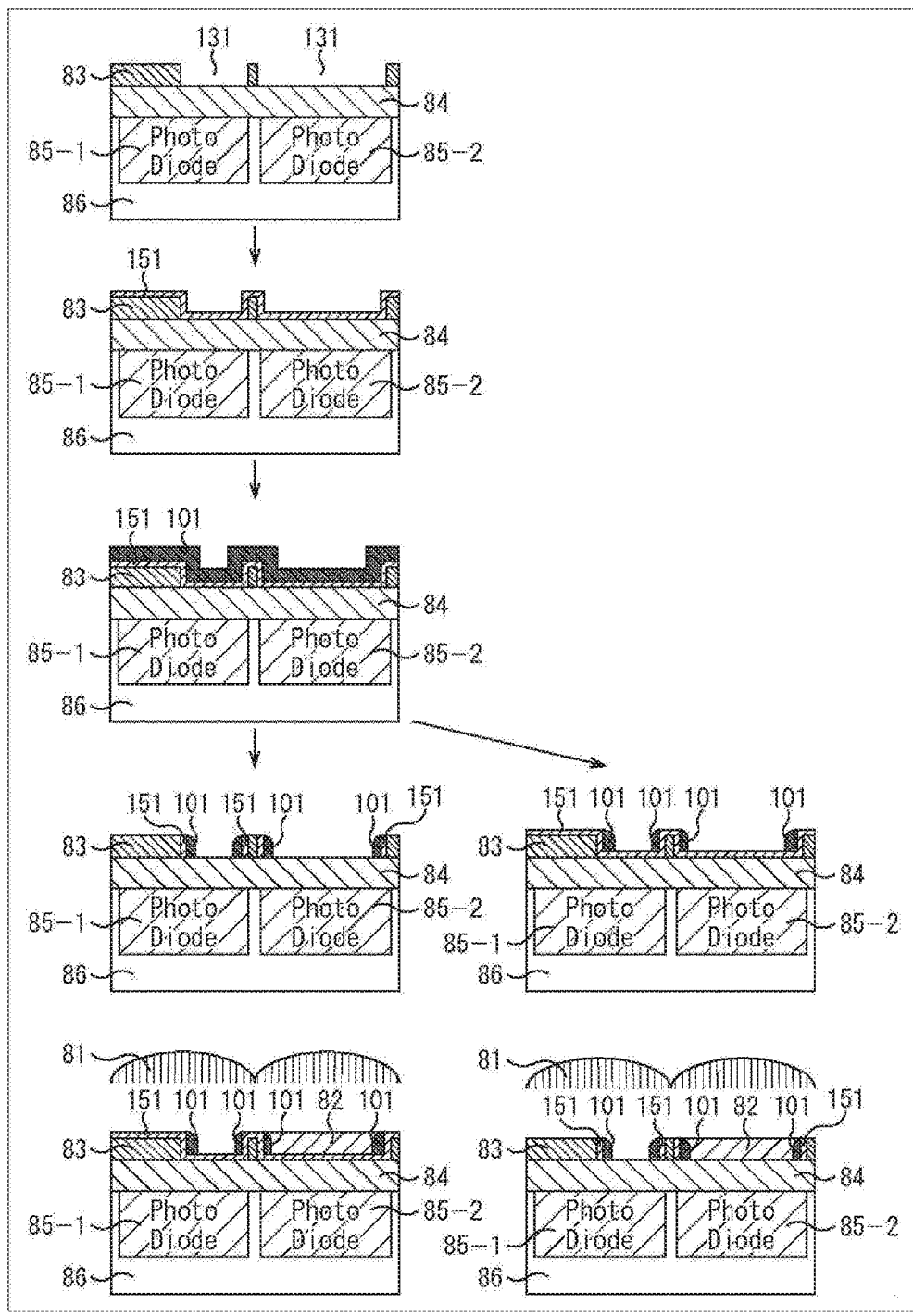
FIG. 9 is a diagram describing a first modification example of the imaging element.

FIG. 9 is a diagram describing the manufacturing processing of an example in which two layers of color mixing prevention films are provided by providing an intermediate film 151 in addition to the color mixing prevention film 101.

That is, the uppermost stage of FIG. 9 shows the same situation as the situation shown by the second stage of FIG. 8. When a plurality of color mixing prevention films are provided, as shown by the second highest stage of FIG. 9, the intermediate film 151 is formed on the entire upper surface including the opening 131 using, for example, SiN.

As shown by the third highest stage of FIG. 9, the color mixing prevention film 101 is formed on the intermediate film 151.

As shown by the left portion of the fourth highest stage of FIG. 9, a side wall film is formed by dry etching or lithography. That is, as shown by the left portion of the fifth highest stage of FIG. 9, a situation in which the intermediate film 151 and the color mixing prevention film 101 are formed on the side surface of the light blocking unit 83 and neither the intermediate film 151 nor the color mixing prevention film 101 is formed on the opening 131 is obtained.

As shown by the right portion of the fourth highest stage of FIG. 9, the intermediate film 151 may be left by controlling the etching amount. In this case, as shown by the right portion of the fifth stage of FIG. 9, the intermediate film 151 is left as a whole, and the color mixing prevention film 101, in addition to the intermediate film 151, is formed on the side wall of the light blocking unit 83. Thereby, the intermediate film 151 is formed as passivation, and such processing is effective in a configuration in which an advantage is obtained by forming passivation.

Second Modification Example

Part of the color mixing prevention film 101 may be left using lithography.

Figure 10:
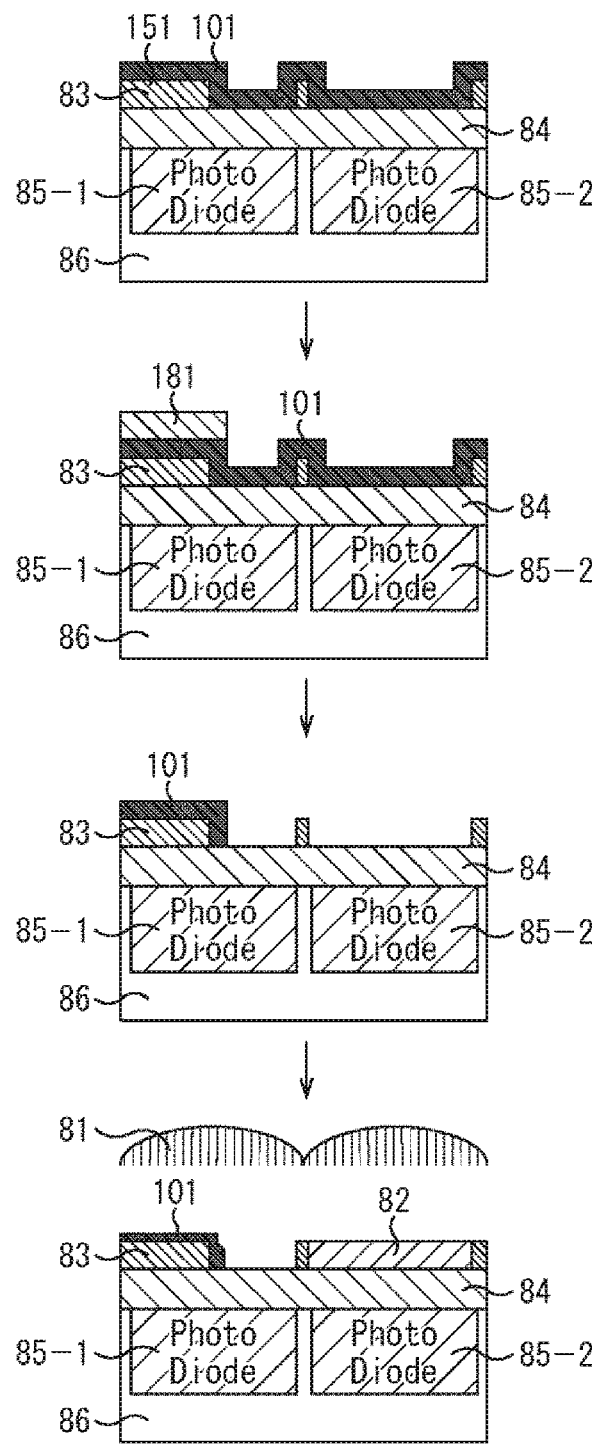
FIG. 10 is a diagram describing a second modification example of the imaging element.

That is, for example, after the color mixing prevention film 101 is formed on the entire upper surface as shown by the uppermost stage of FIG. 10 corresponding to the situation of the third highest stage of FIG. 8, a resist layer 181 is formed only on the upper surface of the light blocking unit 83 where it is desired to leave the color mixing prevention film 101 as shown by the second highest stage of FIG. 10. After that, as shown by the third highest stage of FIG. 10, the color mixing prevention film 101 is formed only on the upper surface and the side wall of the light blocking unit 83 by lithography. By such a configuration, a configuration in which the light blocking unit 83 is not exposed can be obtained, and therefore the occurrence of flares and ghosts at the light blocking unit 83 can be suppressed. That is, the light applied to the upper surface of the light blocking film 83 is scattered to the outside of the sensor. Part of the scattered light is reflected in the cabinet of the imaging device or in the imaging module), and is incident on the sensor again. This is a cause of the occurrence of flares and ghosts. By applying the present technology, the reflected components can be suppressed.

Third Modification Example

Although an example in which the imaging element 52 is of a back-side illumination type is described in the above, a front-side illumination type can be provided similarly.

Figure 11:
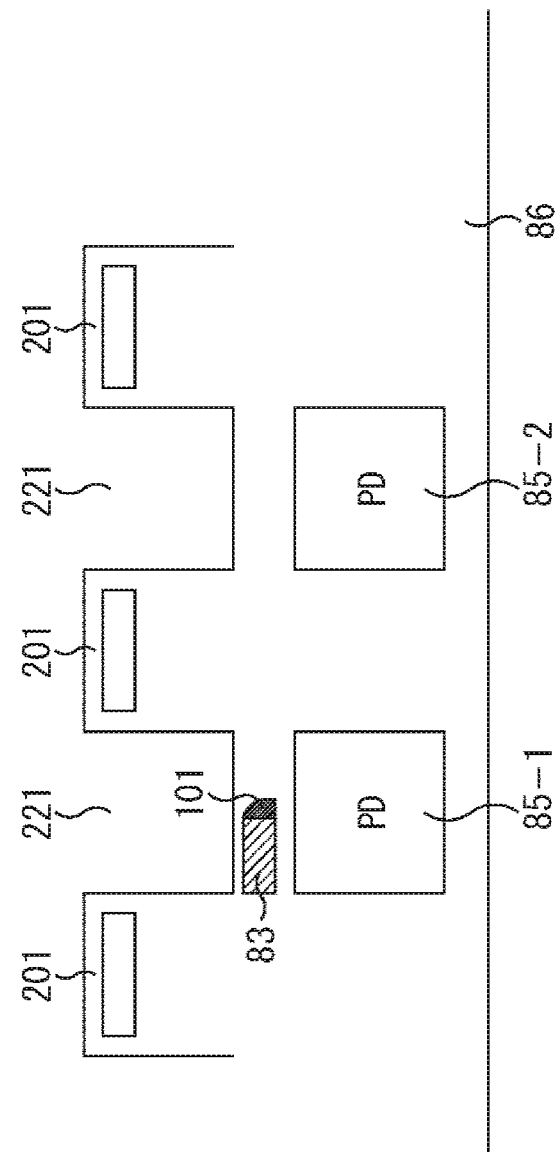
FIG. 11 is a diagram describing a third modification example of the imaging element.

That is, as shown in FIG. 11, the color mixing prevention film 101 may be provided on the side surface of the light blocking unit 83 of the photo diodes 85-1 and 85-2 that are provided at the bottom of an opening 221 of an interconnection layer 201 of a front-side illumination type, for example. Also in FIG. 11, a pixel corresponding to the photo diode 85-1 is a phase difference detection pixel, and a pixel corresponding to the photo diode 85-2 is an ordinary pixel.

The color mixing prevention film 101 is formed by forming the light blocking unit 83 by etching, then forming the color mixing prevention film 101 on the entire upper surface, and then performing dry etching with strong anisotropy so that the color mixing prevention film 101 is left only on the side wall of the light blocking unit 83.

Thus, also in the front-side illumination imaging element 52, effects similar to those in the back-side illumination imaging element 52 are exhibited.

Fourth Modification Example

Figure 12:
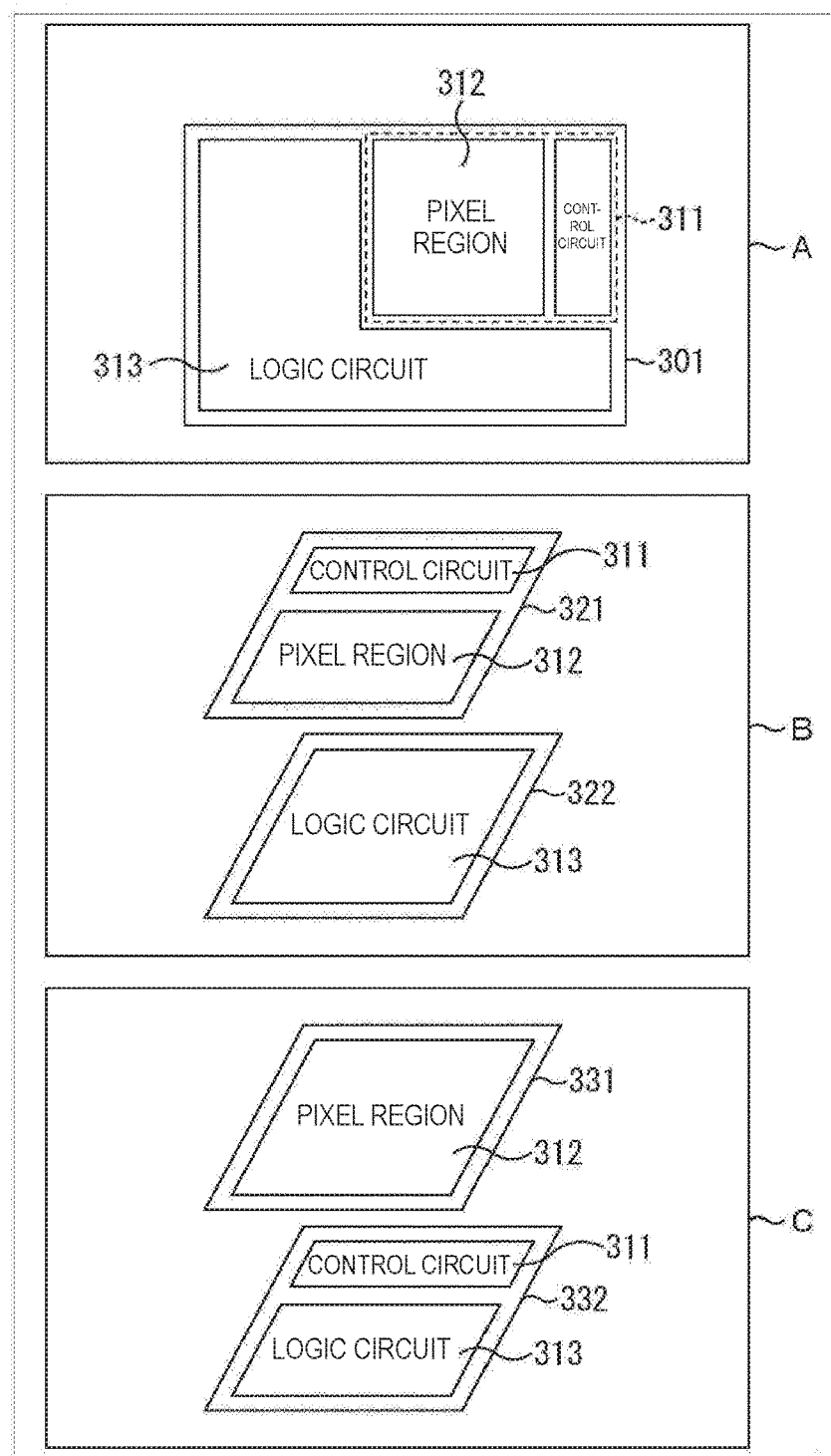
FIG. 12 is a diagram describing a fourth modification example of the imaging element.

The above imaging element 52 is generally a planar configuration in which, as shown by configuration example A of FIG. 12, a control circuit 311, a pixel region 312, and a logic circuit 313 are provided on the same substrate 301, for example.

However, the pixel region 312 may be a configuration provided on an independent substrate. For example, as shown in configuration example B of FIG. 12, also a stacked type in which the control circuit 311 and the pixel region 312 are provided on the same substrate 321 and the logic circuit 313 is provided on another substrate 322 stacked on the substrate 321 is possible.

Alternatively, as shown by configuration example C of FIG. 12, also a stacked type in which only the pixel region 312 is provided on an independent substrate 331 and a substrate 332 provided with the control circuit 311 and the logic circuit 313 is stacked is possible.

Fifth Modification Example

Figure 13:
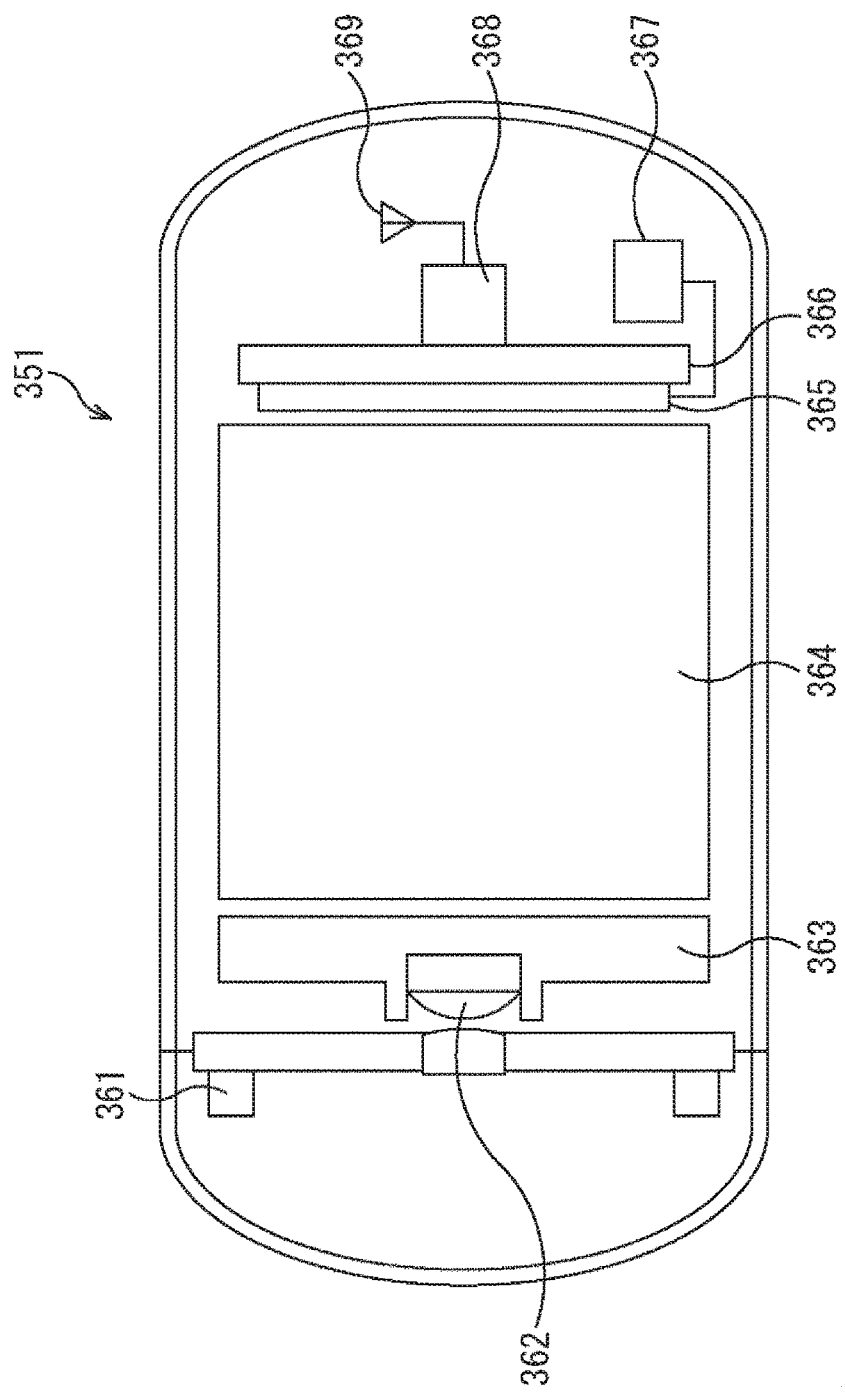
FIG. 13 is a diagram describing a fifth modification example of the imaging element.

Although examples of application to an imaging device are described in the above as examples in which the imaging element 52 is used, the example in which the imaging element 52 is used may be also other electronic devices; for example, a capsule-type endoscope like that shown in FIG. 13 is possible.

FIG. 13 is a configuration example of a capsule-type endoscope using the imaging element 52 described above.

A capsule-type endoscope 351 of FIG. 13 is composed of a light source 361, a lens 362, an imaging element 363, a coil 364, a CPU 365, a memory 366, a reed switch 367, a communication unit 368, and an antenna 369.

The capsule-type endoscope 351 is in a tablet shape, and by being swallowed from the oral cavity of a test subject, sequentially images the internal organs.

The light source 361 illuminates the area to be imaged, and is formed of, for example, a light emission diode (LED) or the like. The lens 362 causes the light incident from the imaging area to be formed as an image on the imaging element 363 in a subsequent stage, and forms an image on the imaging element 363. The imaging element 363 is a similar configuration to the imaging element 52 described above; and takes an image formed by the light incident via the lens 362 being formed as an image, and outputs the image to a CPU 365 in a subsequent stage. The coil 364 is supplied with electric power by electromagnetic induction from the not-illustrated outside.

The central processing unit (CPU) 365 controls the entire operation of the capsule-type endoscope 351; and executes a program stored in the memory 366 composed of a random access memory (RAM), a read only memory (ROM), etc., and stores image data imaged by the imaging element 363.

The reed switch 367 controls the ON or OFF of the power source of the capsule-type endoscope. The wireless transmission unit 368 is controlled by the CPU 365, and transmits and receives data and commands with an operating terminal provided in the outside via the antenna 369.

In the imaging element 363 of the capsule-type endoscope 351, color mixing can be prevented by forming the color mixing prevention film only on the side wall of the light blocking unit in the phase difference detection pixel similarly to the imaging element 52.

Sixth Modification Example

Although examples of the imaging device 11, and the imaging element 52 and the imaging element 363 in the capsule-type endoscope 351 are described in the above, other electronic devices are possible to the extent that they are a device in which an imaging element similar to the imaging elements 52 and 363 is provided; for example, a configuration incorporated in a mobile phone is possible.

Figure 14:
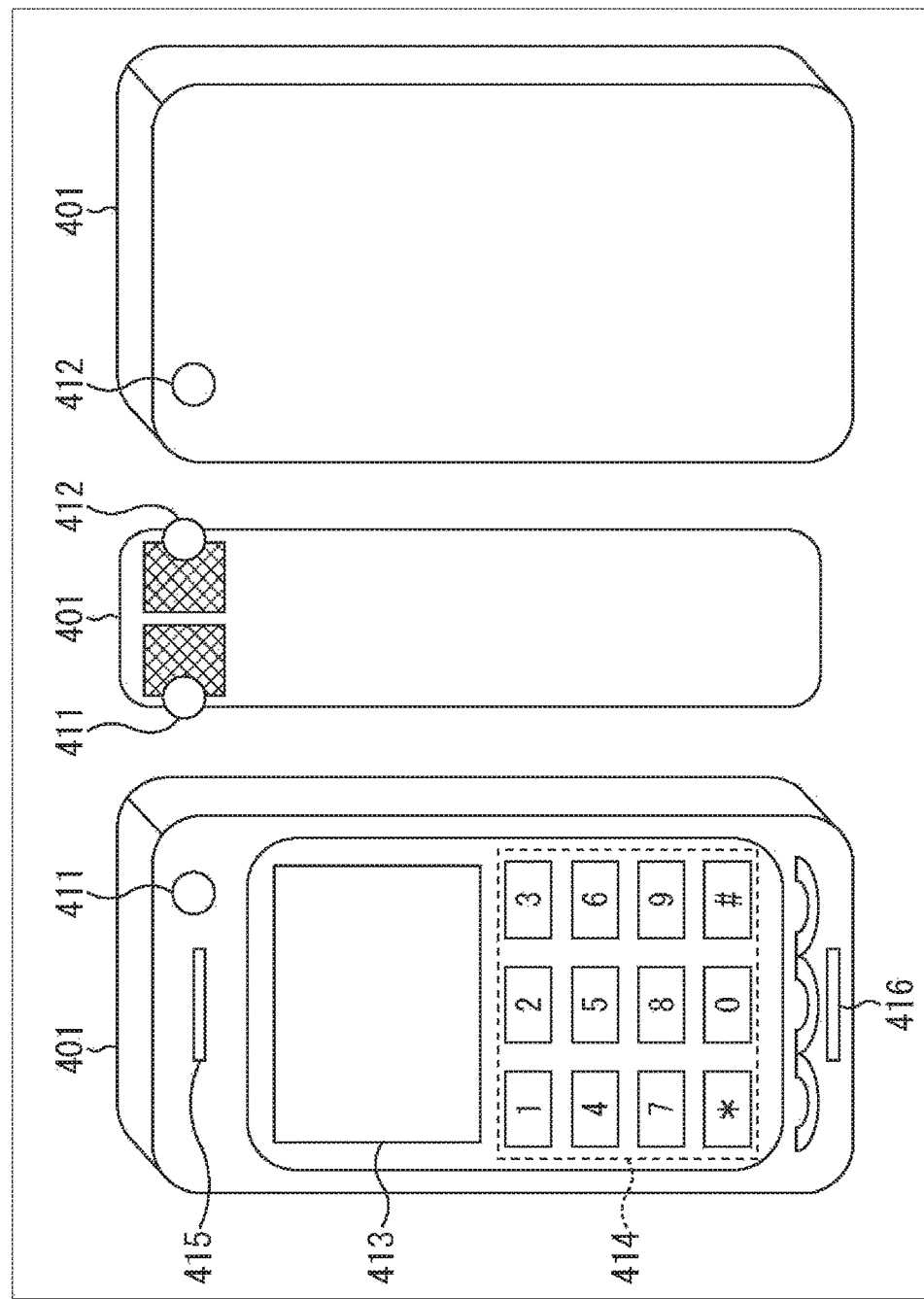
FIG. 14 is a diagram describing a sixth modification example of the imaging element.

FIG. 14 shows a configuration example of a mobile phone in which an imaging element is incorporated.

In a mobile phone 401 of FIG. 14, imaging elements 411 and 412 are provided on both surfaces on the front side and the back side. The mobile phone 401 includes, in addition to the imaging elements 411 and 412, a display unit 413 that displays the operation content and the transmission and reception conditions of an operating unit 414, the operating unit 414 composed of operating buttons, a loudspeaker 415 that outputs sound, and a microphone 416 that receives the input of sound.

The imaging element 411 provided on the entire surface of the mobile phone 401 images the front side of the mobile phone 401. The imaging element 412 provided on the back surface of the mobile phone 401 takes an image on the back side of the mobile phone 401 when the front surface of the mobile phone 401, on which a user wants to operate the mobile phone 401 to perform imaging, faces the user.

Also in the imaging elements 411 and 412 thus provided, color mixing can be prevented by forming the color mixing prevention film only on the side wall of the light blocking unit in the phase difference detection pixel similarly to the imaging elements 52 and 363 described above.

Seventh Modification Example

Figure 15:
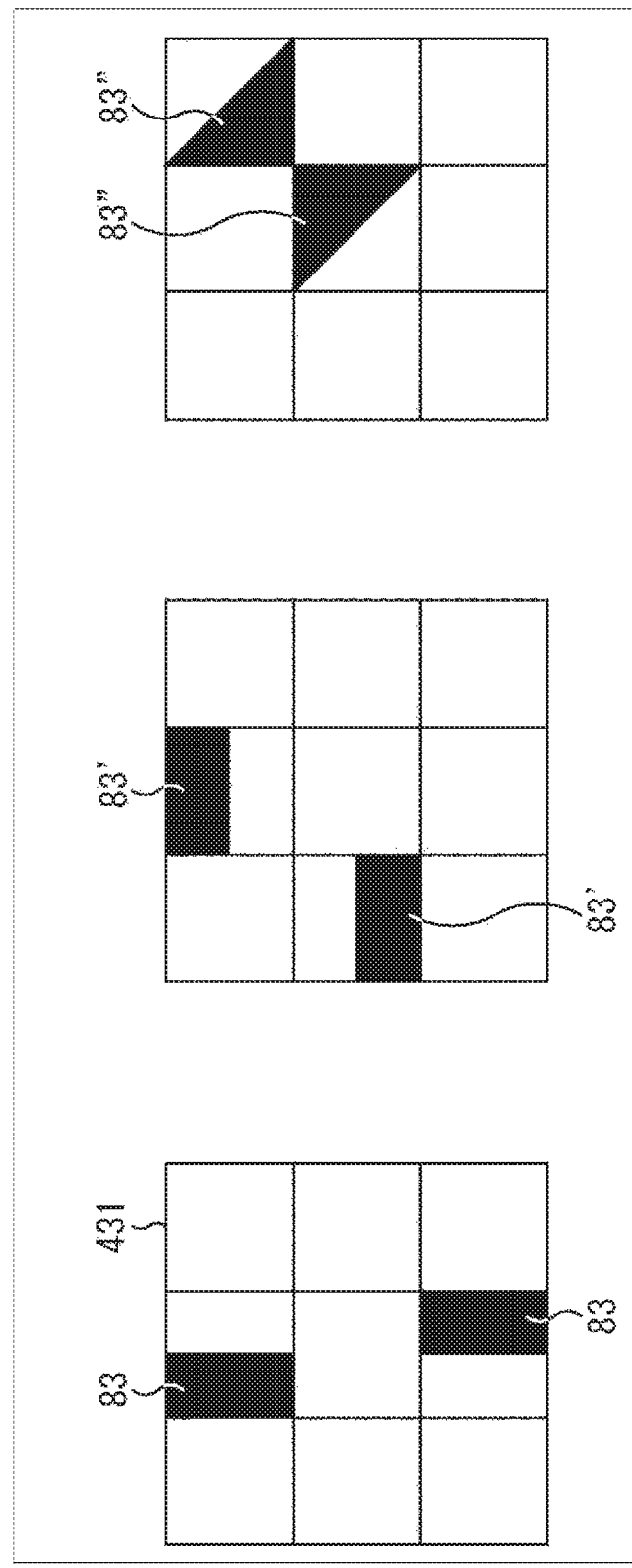
FIG. 15 is a diagram describing a seventh modification example of the imaging element.

In the above, examples in which the light blocking wall 83 of the phase difference detection pixel is provided in a portion on the left or right side of each pixel shown by the square as shown by the left portion of FIG. 15 are described. However, since it is sufficient to be able to shield part of the pixel from light, the light blocking unit does not necessarily need to be provided in a portion on the left or right side of the pixel, and the light blocking unit may be provided as a light blocking unit 83' in a portion on the upper or lower side as shown by the center portion of FIG. 15, for example. The light blocking wall may be provided in, not limited to portions in the horizontal direction and the vertical direction of each pixel, a portion in an oblique direction; for example, a light blocking unit 83" may be provided in areas on an obliquely upper side and an obliquely lower side as shown by the right portion of FIG. 15.

The steps described in the above flow chart may be performed by one apparatus, or may be performed by being assigned to a plurality of apparatuses.

In the case where a plurality of processings are included in one step, the plurality of processings included in the one step may be performed by one apparatus, or may be performed by being assigned to a plurality of apparatuses.

Additionally, the present technology may also be configured as below (1) An imaging element including:
a photo diode that generates a pixel signal for each of a plurality of pixels by photoelectric conversion in accordance with the received light intensity; and
a light blocking unit that blocks part of the incident light on the photo diode of pixels for detecting the phase difference out of the plurality of pixels,
wherein a color mixing prevention film is formed on the side wall of the light blocking unit.

(2) The imaging element according to (1), wherein
the light blocking unit is formed in part of a color filter layer on an interlayer film in a stage prior to the photo diode with respect to the direction of incidence of light, and the color mixing prevention film is formed of a material with a refractive index higher than the refractive index of the interlayer film.

(3) The imaging element according to (2), wherein
the material of the interlayer film includes $SiO_2$, and
the material of the color mixing prevention film includes SiCN, SiN, SiC, SiON, and $HfO_2$ having a higher refractive index than the $SiO_2$.

(4) The imaging element according to any of (1) to (3), wherein the color mixing prevention film formed on the side wall of the light blocking unit is formed to become thicker with respect to the surface of the side wall with movement in the direction of incidence of the light.

(5) The imaging element according to (4), wherein the color mixing prevention film formed on the side wall of the light blocking unit is formed in a curved surface shape.

(6) The imaging element according to (4), wherein the color mixing prevention film on the side wall of the light blocking unit is formed by dry etching.

(7) The imaging element according to (1) to (6), wherein the color mixing prevention film on the side wall of the light blocking unit is formed of a plurality of layers.

(8) The imaging element according to any of (1) to (7), wherein the color mixing prevention film on the side wall of the light blocking unit is formed on the upper surface in addition to on the side wall of the light blocking unit.

(9) The imaging element according to (1), wherein the incident light on the photo diode is light applied by either of front-side illumination and back-side illumination.

(10) An electronic device including:
a photo diode that generates a pixel signal for each of a plurality of pixels by photoelectric conversion in accordance with the received light intensity; and
a light blocking unit that blocks part of the incident light in a stage prior to the photo diode of pixels for detecting the phase difference out of the plurality of pixels,
wherein a color mixing prevention film is formed on the side wall of the light blocking unit.

(11) A method for manufacturing an imaging element,
the imaging element including
a photo diode that generates a pixel signal for each of a plurality of pixels by photoelectric conversion in accordance with the received light intensity, and
a light blocking unit that blocks part of the incident light in a stage prior to the photo diode of pixels for detecting the phase difference out of the plurality of pixels,
wherein a color mixing prevention film is formed on the side wall of the light blocking unit,
the method including:
stacking a layer that forms the light blocking unit;
forming an opening in a position corresponding to the photo diode in the layer that forms the light blocking unit;
forming the color mixing prevention film on the layer that forms the light blocking unit; and
removing part of the color mixing prevention film by the dry etching.

REFERENCE SIGNS LIST 11 imaging element
31 lens
32 operating mode switching dial
33 speed light
34 imaging mode switching dial
35 shutter button
36 cabinet unit
51 optical filter
52 imaging element
53 analogue/digital (A/D) conversion unit
54 clamp unit
55 defect correction unit
56 demosaic unit
57 LM/gamma correction unit
58 luminance chroma signal generation unit
59 video IF
60 display unit
61 recording unit
81 on-chip lens
82 color filter
83 light blocking unit
84 interlayer film
85, 85-1, 85-2 photo diode
86 Si substrate
101 color mixing prevention film

What is claimed is:

1. An imaging element comprising:
a first photo diode configured to generate a pixel signal for a pixel in a plurality of pixels by photoelectric conversion in accordance with a received light intensity; and
a light blocking unit including a first part configured to block a part of incident light on the first photo diode for detecting a phase difference from the plurality of pixels; and
a color mixing prevention film including a first portion on a side wall of the first part of the light blocking unit,
wherein the first portion of the color mixing prevention film includes a bottom surface and a top surface,
wherein the bottom surface is closer to the first photo diode than the top surface,
wherein the top surface has a first edge at the side wall of the first part of the light blocking unit,
wherein the top surface has a second edge opposite the first edge,
wherein the first edge conforms to a shape of the side wall of the first part of the light blocking unit, and
wherein the second edge is rounded.

2. The imaging element according to claim 1, further comprising:
an interlayer film on the first photodiode; and
a color filter on the interlayer film, wherein the light blocking unit is formed in part of the color filter layer on the interlayer film, and the color mixing prevention film is formed of a material with a refractive index higher than a refractive index of the interlayer film.

3. The imaging element according to claim 2, wherein the interlayer film includes $SiO_2$, and the color mixing prevention film includes one or more of SiCN, SiN, SiC, SiON, and $HfO_2$ and has a higher refractive index than the $SiO_2$.

4. The imaging element according to claim 1, wherein the first portion of the color mixing prevention film on the side wall of the first part of the light blocking unit is formed by dry etching.

5. The imaging element according to claim 1, wherein the first portion of the color mixing prevention film on the side wall of the first part of the light blocking unit is part of a plurality of layers on the side wall of the first part of the light blocking unit.

6. The imaging element according to claim 1, wherein the color mixing prevention film includes a part on an upper surface of the first part of the light blocking unit.

7. The imaging element according to claim 1, wherein incident light on the first photo diode is light applied by either of front-side illumination or back-side illumination.

8. An electronic device comprising:
a photo diode configured to generate a pixel signal for a pixel in a plurality of pixels by photoelectric conversion in accordance with a received light intensity;
a light blocking unit including a first part configured to block a part of incident light to the photo diode for detecting a phase difference from the plurality of pixels; and
a color mixing prevention film including a first portion on a side wall of the first part of the light blocking unit,
wherein the first portion of the color mixing prevention film includes a bottom surface and a top surface,
wherein the bottom surface is closer to the photo diode than the top surface,
wherein the top surface has a first edge at the side wall of the first part of the light blocking unit,
wherein the top surface has a second edge opposite the first edge,
wherein the first edge conforms to a shape of the side wall of the first part of the light blocking unit, and
wherein the second edge is rounded.

9. The imaging element according to claim 1, further comprising:
a second photo diode adjacent to the first photodiode, wherein a second part of the light blocking unit is between the first photo diode and the second photo diode, and wherein the color mixing prevention film includes a second portion on a first side wall of the second part of the light blocking unit, and a third portion on a second side wall of the second part of the light blocking unit.

10. The imaging element according to claim 9, wherein the second portion and the third portion of the color mixing prevention film each have curved top surfaces and planar bottom surfaces.

11. The imaging element according to claim 10, wherein each bottom surface of the second portion and the third portion is closer to the first photo diode or the second photo diode than each top surface of the third portion and the second portion.

12. The imaging element according to claim 1, wherein the color mixing prevention film and the light blocking unit are formed of different materials.

* * * * *